United States Patent [19]

Masson et al.

[11] Patent Number: 4,969,191
[45] Date of Patent: Nov. 6, 1990

[54] FULLY DIGITAL PHASE-LOCKED LOOP

[75] Inventors: Jacques L. R. Masson, La Celle Saint Cloud; Jean-Louis Jeandot, Briis Sous Forges, both of France

[73] Assignee: Telecommunications Radioelectriques et Telephoniques, Paris, France

[21] Appl. No.: 115,475

[22] Filed: Oct. 30, 1987

[30] Foreign Application Priority Data

Oct. 31, 1986 [FR] France ................................ 86 15210

[51] Int. Cl.$^5$ .............................................. H04L 9/12
[52] U.S. Cl. ........................................ 380/48; 380/38; 375/120; 328/63; 328/155; 307/511; 331/1 A; 331/25
[58] Field of Search ................... 455/260; 328/155, 63; 375/15, 120; 307/511; 331/25, 1 A; 380/48, 36-38

[56] References Cited

U.S. PATENT DOCUMENTS

| | | | |
|---|---|---|---|
| 3,868,603 | 2/1975 | Guidoux | 375/15 X |
| 3,962,637 | 6/1976 | Motley et al. | 375/15 X |
| 3,971,996 | 7/1976 | Motley et al. | 328/155 |
| 3,978,407 | 8/1976 | Forney, Jr. et al. | 375/15 X |
| 4,004,226 | 1/1977 | Qureshi et al. | 375/15 X |
| 4,004,237 | 1/1977 | Kratzer | 328/155 |
| 4,028,626 | 6/1977 | Motley et al. | 375/15 |
| 4,061,978 | 12/1977 | Motley et al. | 375/15 X |
| 4,237,554 | 12/1980 | Gitlin et al. | 375/15 |
| 4,253,186 | 2/1981 | Godard | 375/15 X |
| 4,262,360 | 4/1981 | Bigo et al. | 375/15 X |
| 4,680,621 | 7/1987 | Baker et al. | 328/155 X |
| 4,862,104 | 8/1989 | Muratani et al. | 331/1 A |

Primary Examiner—Stephen C. Buczinski
Assistant Examiner—Bernarr Earl Gregory
Attorney, Agent, or Firm—Emmanuel J. Lobato

[57] ABSTRACT

A fully digital phase-locked loop comprises a sampler (1), an analog-to-digital converter (2), two quadrature demodulators (3 and 4) and their associated filters (5 and 6), and a decision logic (7) effecting the correction of the sampling phase around the value of the free-running frequency ($f_e$) by the addition or subtraction of machine cycles of a signal processor (9).

5 Claims, 7 Drawing Sheets

FULLY DIGITAL PHASE-LOCKED LOOP

BACKGROUND OF THE INVENTION

The invention relates to a fully digital phase-locked loop realized by means of a digital signal processor and comprising a sampler followed by an analog-to-digital converter and a filtering ensemble connected to the input of a decision logic whose output controls said sampler.

Phase-locked loops are utilized in the widest telecommunication domains (e.g. in radio-locating) as well as in metrology (e.g. for frequency synthesis). The main characteristic feature of these loops is to permit synchronizing with a signal during noise-affected transmissions when the classical detection means are inoperable as a result of the weakness of the received signal. A digital phase-locked loop of the kind mentioned in the preamble is described in the article entitled "Digital Phase-Locked Loop Behavior with Clock and Sampler Quantization" by Carlos Polamaza-Raez and Clare D. McGillem, published in IEEE Trans. on Commun., Vol. COM-33, No. 8, August 1985, pages 753 to 759.

The loop according to the invention has been realized in a cryptophony equipment for ensuring at the receive end the synchronization of the sampling of the digital scrambled speech signal. In such a cryptophony equipment in which scrambling is effected by frequency subband permutation with the aid of digital processing, it is fundamental that at the receive end the exact synchronization of the samples is recovered.

SUMMARY OF THE INVENTION

It is an object of the invention to obtain an accelerated synchronization of the loop by using a dual locking speed allowing of a rapid approach at the start of the convergence and subsequently a slower and more precise approach for the end of the convergence and the follow-up.

In accordance with the invention this object is achieved in an optimal manner with the aid of the following arrangements:

(a) The said phase-locked loop comprises, after the said analog-to-digital converter, two quadrature demodulators operating at the loop synchronizing frequency and their respective filters, at whose outputs a signal y tending towards zero after convergence and a signal z permit the loop to introduce a major or minor correction depending on whether the absolute value of y is superior or inferior to a threshold value.

(b) The said decision logic effects correction of the sampling phase by delaying or advancing the sampling instant by the addition or subtraction of a certain number of machine cycles of the said digital processor.

(c) When a synchronizing pilot signal is inserted at the transmit end into the signal to be transmitted and to be applied to the input of the digital phase-locked loop, the loop permits recovering a correct sampling phase of this pilot signal.

(d) As the synchronizing wave of this pilot signal is not a carrier of other information, it is eliminated by compensation with the aid of the said phase-locked loop. This arrangement permits to place the synchronizing wave in whatever portion of the passband of the signal to be transmitted, more particularly, by using a frequency which bears a simple ratio to the sampling rate $f_e$ (non-limitative) example: $f_e/3$, $f_e/4$, etc . . .).

BRIEF DESCRIPTION OF THE DRAWING

The following description with reference to the annexed drawings, given by way of non-limitative example, will make it better understood how the invention can be realized.

DETAILED DESCRIPTION OF THE INVENTION

In the following description hereinbelow, the application of the phase-locked loop according to the invention will be described for synchronizing the sampling of a digital scrambled signal, the scrambling having been effected by permutation of the frequency sub-bands. After transmission, the said signal cannot be used immediately as will be shown by the following analysis of its sampling phase.

Let $x^b(n)$ be the transmitted digital scrambled signal and $x^{br}(n)$ the digital scrambled signal after transmission through the analog channel.

It is supposed that the channel has an impulse response equal to $\delta(t-D)$, that is to say the digital signal on reception is equal to the digital signal before transmission, but delayed by an amount D so that:

$$x^{br}(n) = x^b(n-D)$$

In order that the unscrambling is performed correctly, the value of D is not unimportant; as a matter of fact, after analysing signal x, it appears that the sub-band signals $x_0, x_1, \ldots x_{N-1}$ corresponding to sub-bands $0, 1, \ldots, N-1$, respectively, must satisfy the condition:

$$x_k^{br}(m) = x_k^b(m-m_0)$$

in which $m_0$ is an integer, that is to say that the sub-band signals have to be recovered as they have been calculated apart from delay. As the sampling of the sub-band signals is effected at $f_e/N$ ($f_e$=sampling rate and N=number of sub-bands), the delay $m_0$ must be a multiple of NT for ensuring this property ($T=1/f_e$).

During the subjective evaluations of the quality of the restored speech signal at the unscrambler of the said cryptophony equipment, it has been found that the above-mentioned condition could be realized with a tolerance on the sampling phase amounting to ±5% of the period T.

Figure 1:
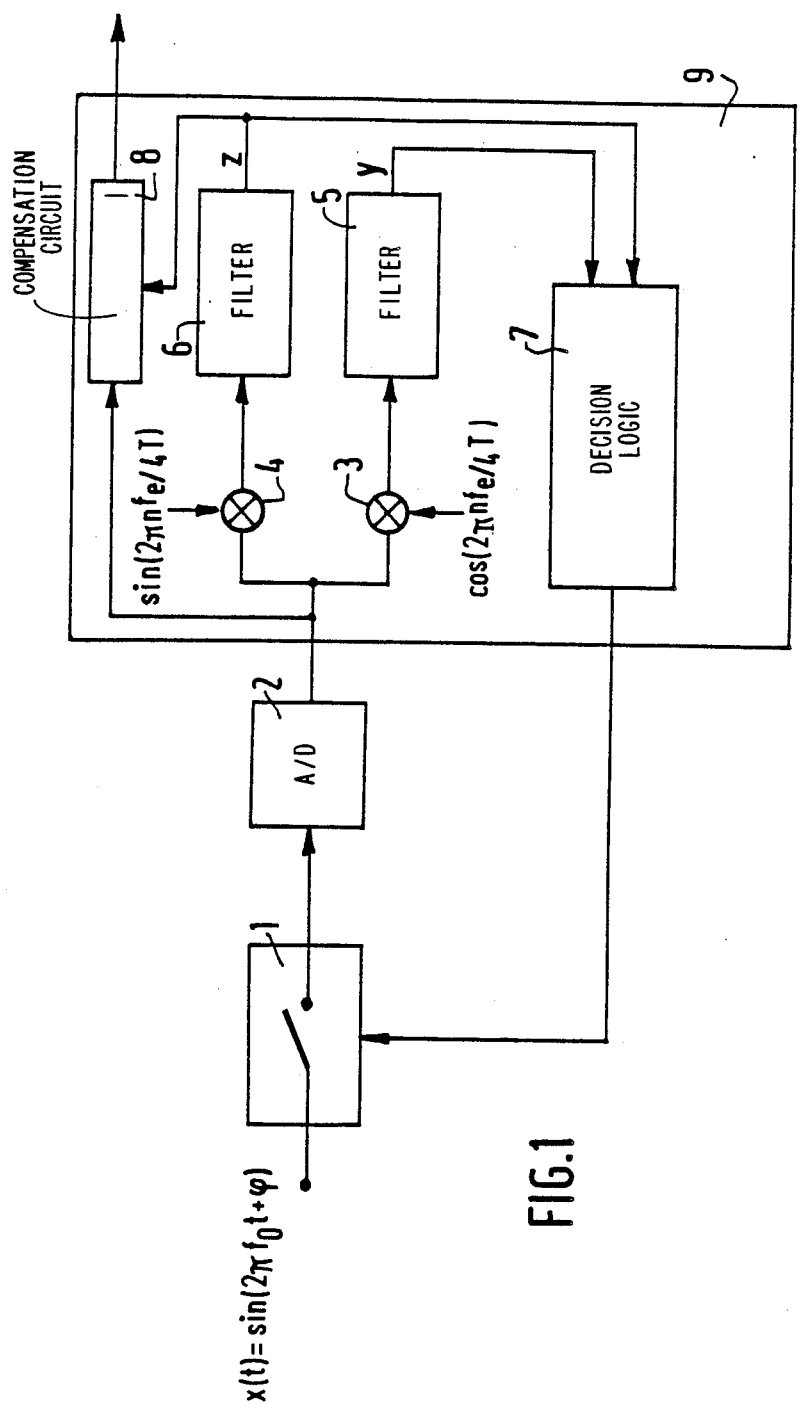
FIG. 1 shows the schematic diagram of a fully digital phase-locked loop in accordance with the invention and operating at a synchronizing wave frequency of $f_e/4$.

For achieving this object, a fully digital phase-locked loop realized with the aid of a signal processor has been studied. This loop whose schematic diagram is shown in FIG. 1, comprises the following constituent elements:

a sampler 1 and an analog-to-digital converter 2;

two quadrature demodulators (cosine and sine) 3 and 4 and their associated filters 5 and 6 producing the signals y and z, respectively; and a decision logic 7 allowing to correct the sampling phase.

The signal z coming from demodulator 4 is subtracted from the received signal in a compensation circuit 8 for eliminating the synchronization carrier.

The ensemble of elements 3 to 8 is accommodated in a digital signal processor 9.

The correction of the sampling phase is effected around the value of the free-running frequency $f_e$ by the addition or subtraction of a certain number of machine cycles of the digital processor 9.

Figure 2:
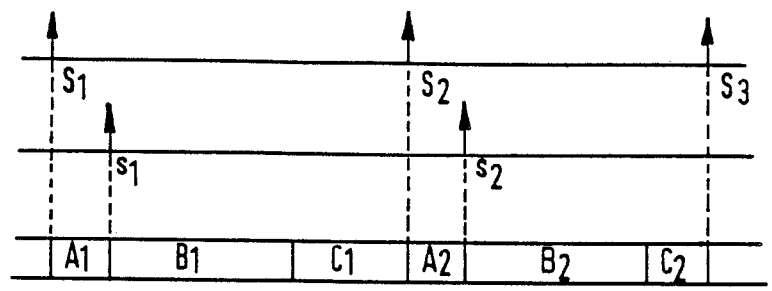
FIG. 2 shows the characteristic instants of the program realizing the loop.

The timing of the program realizing the loop is shown in FIG. 2, in which the sampling commands directly acting on the sampler-blocker are indicated by the arrows $S_i$ (i=1, 2, 3, ...) and the acquisition of samples is indicated by the arrows $s_i$ (i=1, 2, 3, ...)

Between two consecutive sampling commands, two zones of a fixed duration are found: a latency zone $A_i$ (i=1, 2, 3, ...) to obtain the sample and a zone $B_i$ (i=1, 2, 3, ...) where the calculation is made of the correction to be applied for each sample introduced at the input of the loop. This "correction" zone $B_i$ is followed by a "buffer" zone $C_i$ (i=1, 2, 3, ...) of a duration varying with the result of the said calculation of the correction.

For example, for a sampling period of 125 μs ($f_e$=8 kHz) and for a processor cycle time of 200 ns, a spacing of 125/(0.2)=625 machine cycles between two consecutive sampling commands would be obtained if the said correction were zero, that is to say if the signal frequencies before and after transmission were identical. As these frequencies are different, the processor elaborates a correction and according to the value of this correction a certain number of units will be subtracted from the above-mentioned number of 625 machine cycles or added to them in order to advance or delay the next sampling command.

Thus, the variable voltage of a VCO in an analog phase-locked loop is replaced by a variation of machine cycles in the digital phase-locked loop.

In order to simplify the processes to the highest degree, the synchronizing signal frequency $f_0$ is chosen such that $f_0 = f_e/4$. This choice is non-limitative and hereinafter the realized processes will be explained for a synchronizing signal frequency of $f_e/p$, with p being an integer exceeding 2.

A signal for which holds $f_0 = f_e/4$ can be represented in a digital form by the sequence +A, 0, −A, 0, +A, 0 ..., where A represents the peak amplitude of the synchronizing signal. At the receive end, after sampling at a rate $f_e$: $\sin(2\pi f_e t/4)$ can be represented by the sequence 0, +1, 0, −1, 0, +1, ..., and $\cos(2\pi f_e t/4)$ by the sequence +1, 0, −1, 0, +1, 0, ..., which particularly simplifies the demodulation operations.

If the synchronizing signal is sampled with a phase error $\phi$, it can be represented by the sequence $$A\sin(2\pi n f_e T/4 + \phi) = A\sin(n\pi/2 + \phi)$$

where n is a running index designating the number of the sample considered.

Then the following sequence of the samples is obtained: $A\sin\phi$, $A\cos\phi$, $-A\sin\phi$, $-A\cos\phi$, $A\sin\phi$, ... which yields the following sequences v(n) at the output of demodulator 4 and v(n) at the output of demodulator 3:

v(n)=0, Acos ϕ, 0, Acos ϕ, 0, ...

u(n)=Asin ϕ, 0, Asin ϕ, 0, Asin ϕ, ...

By sub-sampling the outputs of the demodulators and retaining only the significant instants, that is to say by ignoring the multiplications by the zero in the demodulators, these two sequences become Acos ϕ, Acos ϕ, Acos ϕ, ... and Asin ϕ, Asin ϕ, Asin ϕ, ..., respectively.

During the convergence of the loop, the value of ϕ will tend towards 0, and the sequences will tend towards A, A, A, ... and 0, 0, 0, ..., respectively.

Figure 3:
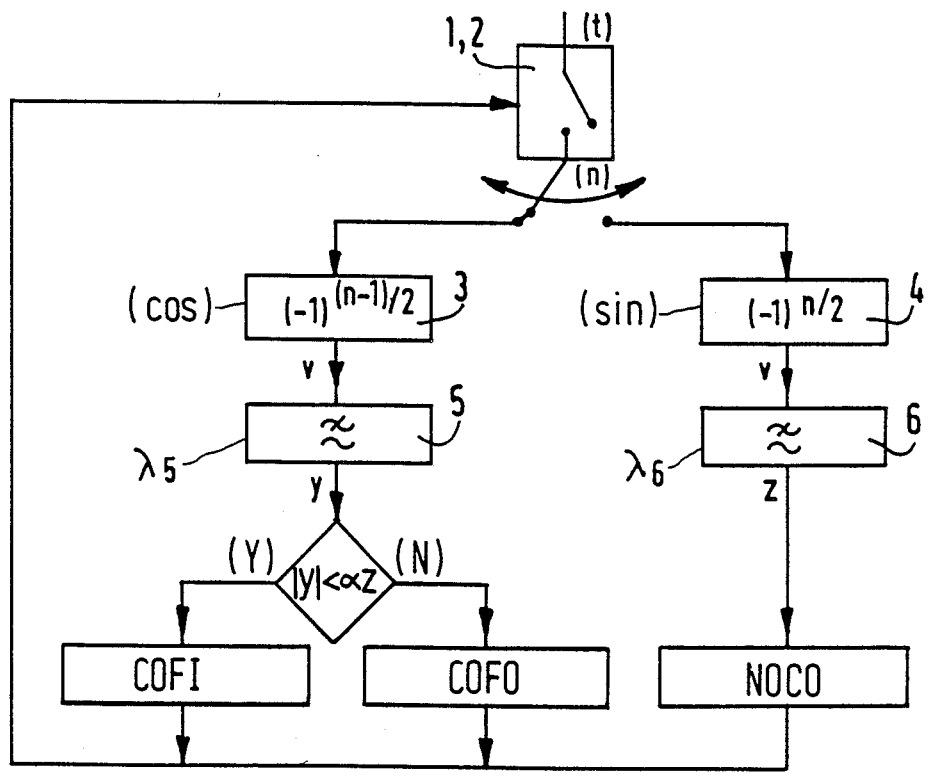
FIG. 3 shows the flow chart diagram of the correcting process.

With the aid of the output signals of the filter cells 5,6 located after the demodulators (signals denoted y and z), it is possible to have the loop operate in two modes: rapid but rough acquisition, end of convergence and follow-up, according to the flow-chart diagram of FIG. 3.

In this flow-chart diagram, the functions of sampling and analog-to-digital conversion of the input signal x(t), shown in a distinct manner by elements 1 and 2 in the FIG. 1, are here regrouped into the block 1,2 indicating, furthermore, that only the non-zero values of the samples are used and transmitted to the local demodulators 3 and 4.

The output signals u(n) and v(n) of these demodulators are then filtered by the first-order recursive low-pass filters 5 and 6 whose frequency response H(Z) is expressed by:

$$H(Z) = \frac{\lambda_i}{1 - (1 - \lambda_i)Z^{-1}}$$

where $\lambda_i$ (i=5 or 6) characterizes the passband of the filter: the lower the value of $\lambda_i$, the narrower the passband will be (in practice $\lambda_5 \approx 1/256$ and $\lambda_6 \approx 1/64$, producing a stronger filtering in filter 5 than in filter 6).

At the output of the digital filters the signals y(n) and z.n.() are obtained. The signals u.n.(), y.n.(), z(n) are used for determining the correction to be introduced. In case there is a static phase error (or a phase error varying slowly with respect to the cut-off frequencies of filters 5 and 6), y(n) tends towards Asin ϕ and z(n) tends towards Acos ϕ.

First, the absolute value |y(n)| is compared to a threshold defined by: threshold=αz(n), where $\alpha \approx \frac{1}{4}$). This comparison results in different actions:

if |y(n)| exceeds the threshold, (N) in FIG. 3, this means that the phase shift ϕ is important, and a major correction (COFO in FIG. 3) of the sampling phase is made, this correction consisting in a variation of 10 machine cycle periods, the direction of the correction being determined by the sign of u(n):

= if u(n)<0 (ϕ negative.), the sampling instant is delayed by adding 10 cycle periods, which tends towards algebraically incrementing ϕ, thus towards bringing it closer to zero.

= if u(n)>0 (ϕ positive), the sampling instant is advanced, which again tends towards bringing ϕ closer to 0.

if |y(n)| is smaller than the threshold, (Y) in FIG. 3, it is decided to make a minor correction (COFI in FIG. 3) of the sampling instant, which consists in making the latter vary by one machine cycle at every p samples y(n); (for example: p=8, or 16, or 32 depending on the correction rate desired), the direction in which the correction is made being determined by the sign of u(n).

No correction at all is made in response to the signal z(n), which fact is indicated by the block having the label NOCO in FIG. 3.

Figure 4:
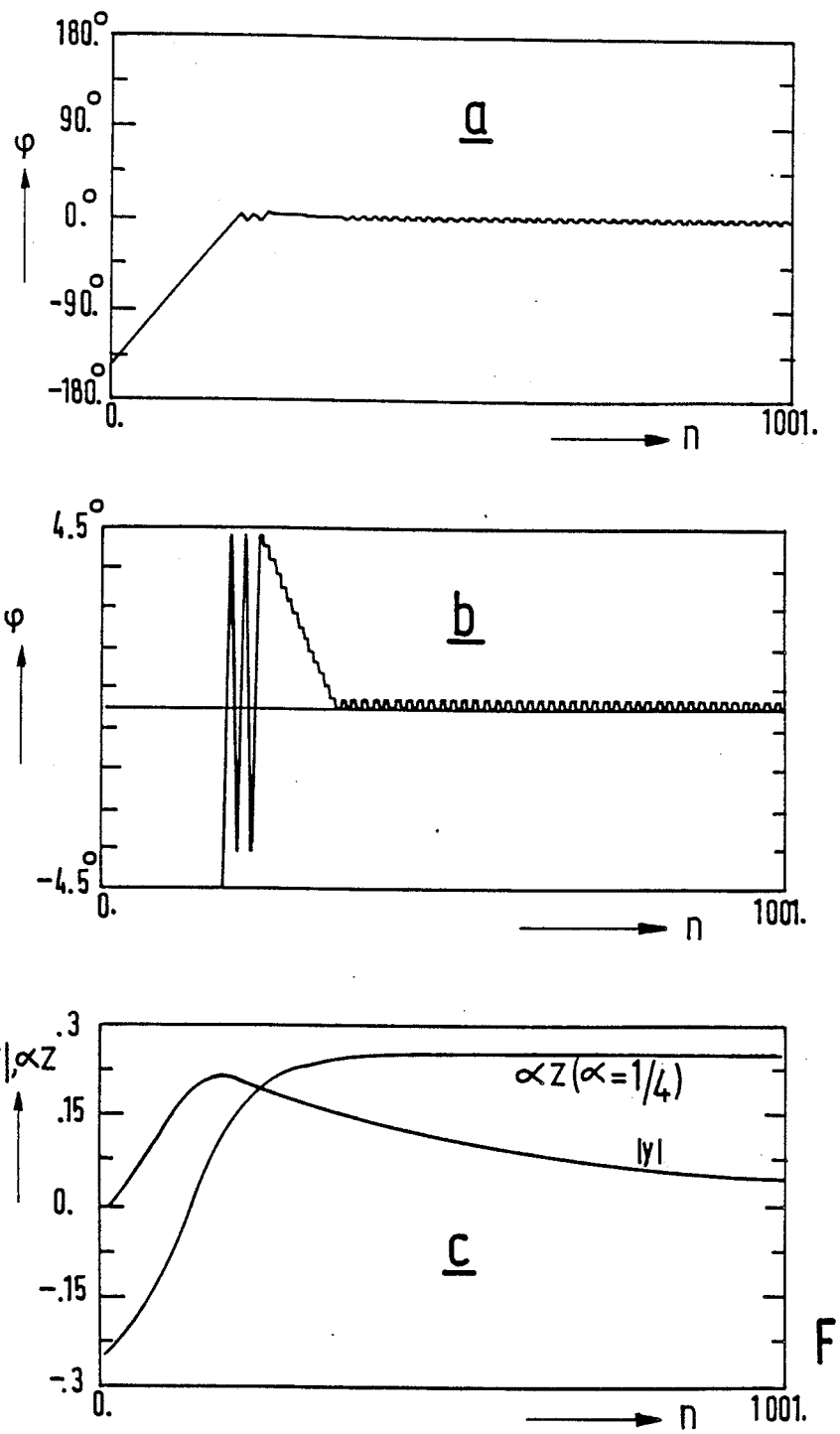
FIGS. 4, 5, 6 and 7, respectively, show the simulation results and analysis in the ideal case, the case with oscillator drift, the case with addition of noise, and the case with noise and drift.

The behavior of the loop in a simulated process has been analysed in the ideal case (see FIG. 4).

FIG. 4a shows the development of the sampling phase error $\phi$ during acquisition as a function of n, the order number of the sample considered.

FIG. 4b shows an enlargement of the preceding curve between $\pm 4.5°$, representing the deviation by $\pm 5\%$ that can be tolerated in the sampling period.

FIG. 4c shows the development of the absolute value $|y|$ and the threshold $\alpha z$ (where $\alpha = \frac{1}{4}$). The intersection of the two curves corresponds to the instant of switching between rapid and slow approach.

When the digital loop is started, the phase error $\phi$ is $-135°$ in the example considered; a process of rapid convergence process is initiated, as shown by the linear part of FIG. 4a. When the phase 0 is attained, a second process is initiated, as shown in FIGS. 4a and 4b by the oscillations around 0, caused by major corrections bearing the sign of u(n). However, as the phase $\phi$ remains around 0, the signal y(n) corresponding to a drastic filtering of Asin $\phi$ starts approaching zero, and a third process is initiated when an absolute value $|y(n)|$ smaller than the given threshold is attained; this third process is the final convergence with the aid of minor corrections, as shown by the part of FIG. 4b that is quasi-linear and that is followed by oscillations of low amplitude in the neighborhood of zero, produced by the quantizing of the corrections.

Figure 5:
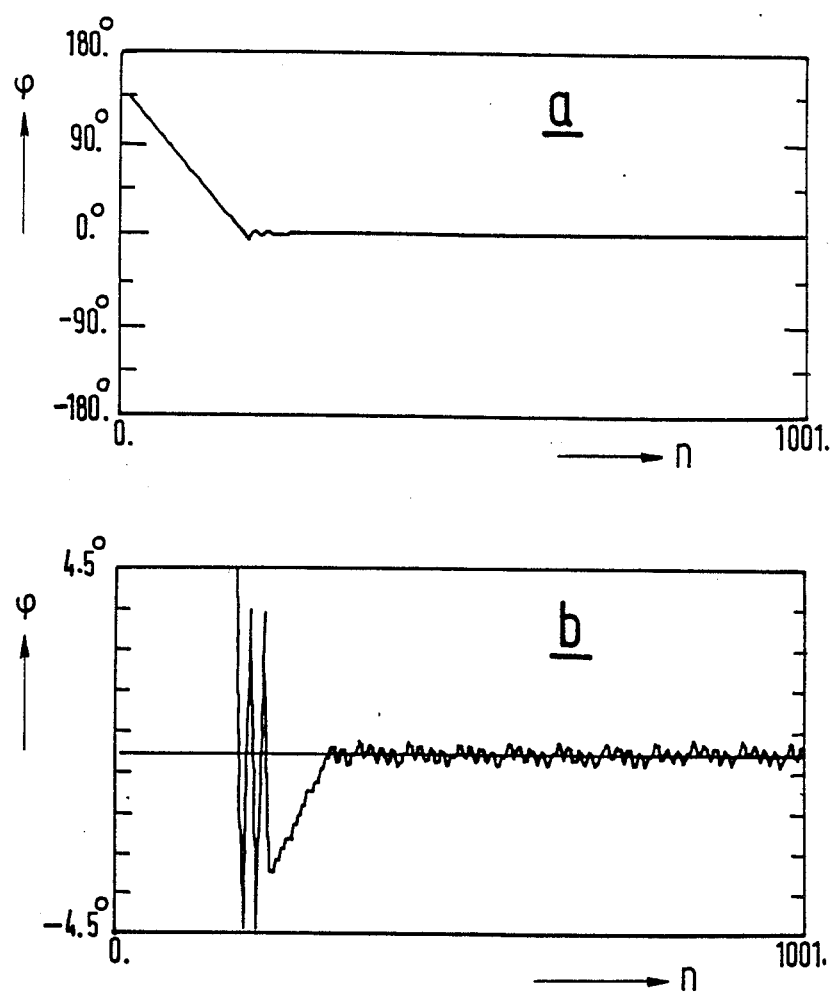

FIGS. 5a and 5b show a convergence in the case of a shift of the free-running frequency (having a relative value of $5 \times 10^{-5}$) between the synchronizing wave and the sampling wave. The larger phase oscillations around zero are a result of the necessity to correct the local frequency permanently.

Figure 6:
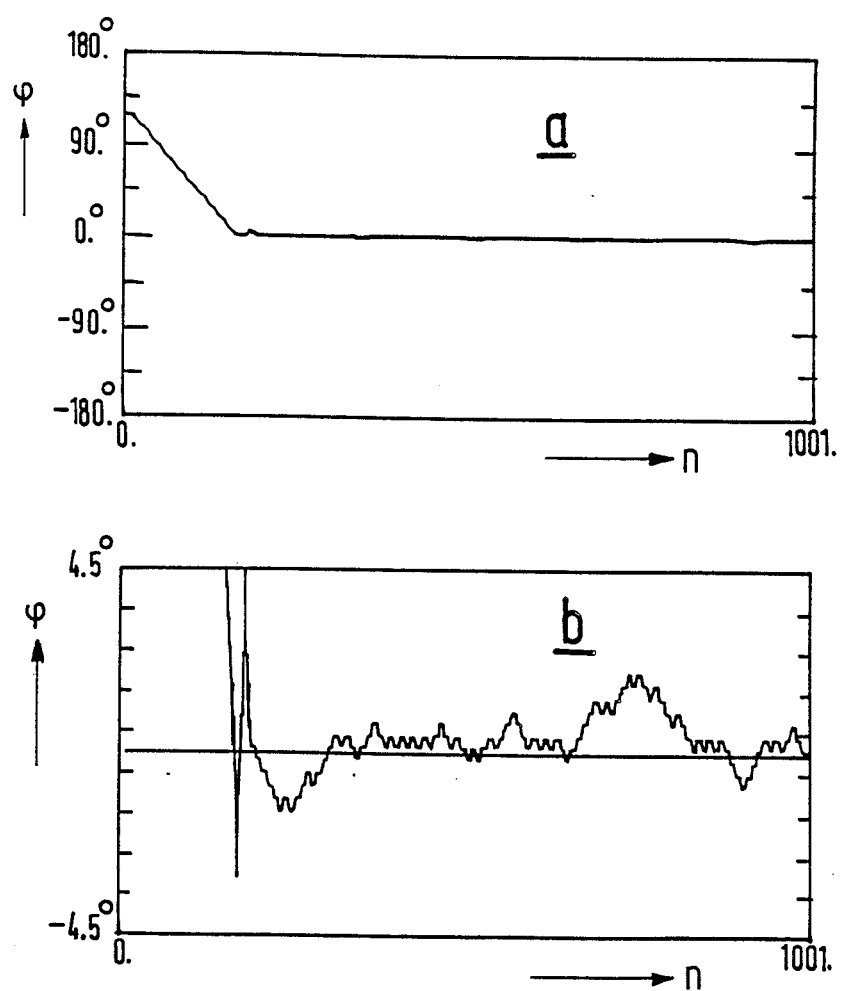

FIGS. 6a and 6b show the behavior of the loop when noise occurs but without a shift of the free-running frequencies, the signal-to-noise ratio being 28 dB. Owing to the drastic filtering realized by filters 5 and 6, the noise affects the sampling phase after convergence only very slightly.

Figure 7:
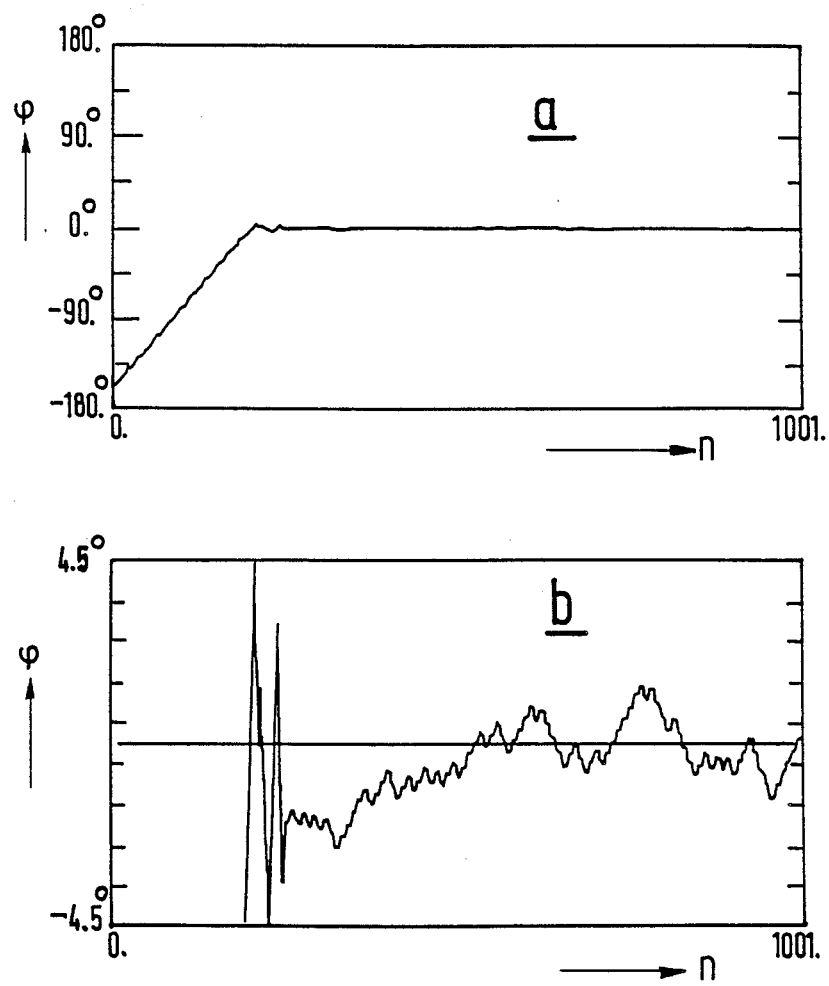

FIGS. 7a and 7b show a convergence when noise occurs as well as a shift of the free-running frequencies (signal-to-noise ratio having a value of 28 dB, frequency shift having a relative value of $5.10^{-5}$).

The behavior of the loop is still acceptable with a 20 dB signal-to-noise ratio and a drift of $10^{-4}$.

In addition, the precision of the convergence permits suppression of the synchronization carrier by compensation at the output of the arrangement. Indeed, it is a matter of subtracting from the received signal a sampled sinusoidal wave whose phase is very near zero and whose amplitude is closely approximated by z(n), because $z(n) = A\cos \phi \approx A$ when $\phi \approx 0$. By subtracting the sequence $0, +A, 0, -A, \ldots$ from the sequence of received samples, in fact a sinusoidal Asin $(2\pi n f_e T/4)$ is subtracted which is a good approximation of $A\sin(2\pi n f_e T/4 + \phi)$ when $\phi$ is very near 0. If the absolute value $|\phi|$ is smaller than 4.5°, the remainder of the synchronizing wave is reduced by at least 22 dB with respect to the initial wave, permitting to choose, if desired, a frequency located in the passband of the channel (for example: $f_e/4$, $f_e/3$, etc . . . ).

The fully digital loop realized thus presents the following main characteristic features:

rapid acquisition (approximately a hundred sampling periods), a correct follow-up in the presence of disturbances occur (noise, drift), a simple realization with the aid of a signal processor, and a very good compensation of the wave used for the synchronization.

Figure 8:
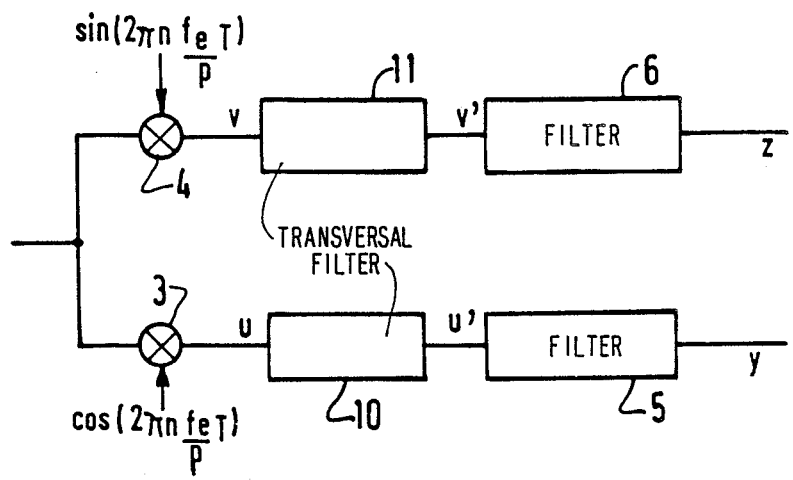
FIG. 8 shows the modification of FIG. 1 in the general case in which the synchronizing wave frequency is equal to $f_e/p$ (where p is an integer exceeding 2)

The phase-locked loop operates in completely the same manner when the synchronizing frequency is no longer equal to $f_e/4$, but to $f_e/p$ (where p is an integer with $p > 2$, $p \neq 4$). In this case the schematic diagram of the phase-locked loop shown in FIG. 1 must be modified in accordance with the diagram of FIG. 8 by inserting the transversal filters 10 and 11 before the recursive filters 5 and 6, respectively, as will be explained hereinafter for p=3 by way of a non-limitative example.

The sampled synchronizing wave can be represented by $A\sin(2n\pi f_e T/3 + \phi) = A\sin(2n\pi/3 + \phi)$. The demodulators 3 and 4 use the respective signals:

$$\cos(2\pi n f_e T/3) = 1, -\tfrac{1}{2}, -\tfrac{1}{2}, 1, \ldots$$

$$\sin(2\pi n f_e T/3) = 0, +\sqrt{3}/2, -\sqrt{3}/2, 0, +\sqrt{3}/2, \ldots$$

The respective sequences of the states at the output of demodulators 3 and 4 are u(n): Asin $\phi$, $-\tfrac{1}{2}$ Asin($\phi + 2\pi/3$), $-\tfrac{1}{2}$ Asin($\phi + 4\pi/3$), . . .

v(n): 0, $\sqrt{3}/2$ Asin($\phi + 2\pi/3$), $-3/2$ Asin($\phi + 4\pi/3$), . . .

Accordingly, there appear periodic amplitude variations having a frequency $f_e/3$ (the same type of variations existed in the case of p=4, with:

u(n) = Asin $\phi$, 0, Asin $\phi$, . . .

v(n) = 0, Acos $\phi$, 0, . . .

but they were eliminated by the sub-sampling).

These amplitude variations are eliminated by means of transversal filters 10 and 11 having p (=3 in our example) coefficients equal to 2/p (=$\tfrac{2}{3}$ in our example).

These filters 10, 11 produce respective output signals:

$$\begin{aligned}
u'(n) &= 2[u(n) + u(n-1) + u(n-2)]/3 \\
&= 2\{A\sin\phi - [A\sin(\phi - 2\pi/3) + A\sin(\phi - 4\pi/3)]/2\}/3 \\
&= A\sin\phi
\end{aligned}$$

and $$\begin{aligned}
v'(n) &= 2[v(n) + v(n-1) + v(n-2)]/3 \\
&= 2\{0 + \sqrt{3}\,[A\sin(\phi - 2\pi/3) - A\sin(\phi - 4\pi/3)]/2\}/3 \\
&= A\cos\phi
\end{aligned}$$

Thus, a return to the preceding case is effected, provided that u'(n) and v'(n) are used instead of u(n) and v(n) in the calculation of the correction. When the process converges, y(n) tends towards 0 and z(n) tends towards A, which makes it still possible to compensate for the synchronizing signal by subtracting from the received signal the sequence 0, Asin(2π/p), Asin(4π/p), Asin(6π/p), . . .

What is claimed is:

1. A fully digital phase-locked loop, comprising:
   a sampler for sampling an input signal at a controllable sampling rate;
   an analog-to-digital converter for converting the sampled input signal to a digital signal;
   quadrature demodulating means operative at a loop synchronizing frequency and receptive of the digital signal from said analog-to-digital converter for developing a first output signal which tends toward zero as the phase-locked loop becomes synchronized and for developing a second output signal for determining a rate of correction of the phase-locked loop according to a value of said first output signal; and
   means comprised of a decision logic circuit and responsive to said first and second output signals of said demodulating means for controlling the sampling rate of said sampler to maintain the phase-locked loop synchronizing by minimizing said first output signal of said demodulating means at a rate determined by said second output signal of said demodulating means.

2. A phase-locked loop as claimed in claim 1 wherein said phase-locked loop permits recovery of a correct sampling phase of a synchronizing pilot signal inserted into a signal to be transmitted and to be applied to the input of said phase-locked loop.

3. A phase-locked loop as claimed in claim 2, wherein said loop comprises means for eliminating the synchronizing wave of the pilot signal, thereby permitting situating the frequency of the pilot signal in a passband of the signal to be transmitted in such a manner that the pilot signal bears a simple ratio to the sampling rate.

4. A phase-locked loop as claimed in claim 1, wherein said demodulating means and said means for controlling the sampling rate are comprised of a single digital signal processor.

5. A phase-locked loop as claimed in claim 4, comprised of a digital signal processor, wherein said decision logic circuit effects correction of a sampling phase by changing a sampling instant by the addition or subtraction of a number of machine cycles of said digital signal processor in the processing of a sample.

* * * * *